(12) United States Patent  
Liu et al.

(10) Patent No.: US 11,302,888 B2  
(45) Date of Patent: Apr. 12, 2022

(54) DISPLAY PANEL AND DISPLAY DEVICE

(71) Applicant: WUHAN TIANMA MICRO-ELECTRONICS CO., LTD., Wuhan (CN)

(72) Inventors: Haimin Liu, Shanghai (CN); Zhiyong Xiong, Shanghai (CN); Liujing Fan, Shanghai (CN); Xue Wang, Shanghai (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 78 days.

(21) Appl. No.: 16/416,487

(22) Filed: May 20, 2019

(65) Prior Publication Data

US 2020/0168837 A1 May 28, 2020

(30) Foreign Application Priority Data

Nov. 28, 2018 (CN) .......................... 201811432719.7

(51) Int. Cl.
*H01L 27/32* (2006.01)
*H01L 51/52* (2006.01)

(52) U.S. Cl.
CPC ...... *H01L 51/5246* (2013.01); *H01L 51/5271* (2013.01); *H01L 27/3244* (2013.01)

(58) Field of Classification Search
CPC .................. H01L 27/3267; H01L 51/5246
See application file for complete search history.

(56) References Cited

U.S. PATENT DOCUMENTS

2015/0060789 A1* 3/2015 Cho .................... H01L 51/5234
257/40
2016/0029502 A1* 1/2016 Lee ..................... H01L 51/5246
361/748

FOREIGN PATENT DOCUMENTS

| CN | 107046104 A | 8/2017 |
| CN | 107579167 A | 1/2018 |
| CN | 107644945 A | 1/2018 |
| CN | 107808936 A | 3/2018 |

* cited by examiner

*Primary Examiner* — Trang Q Tran  
(74) *Attorney, Agent, or Firm* — Anova Law Group, PLLC

(57) ABSTRACT

A display panel comprises a first substrate; a second substrate; a display region; an encapsulation region disposed at a periphery of the display region; an encapsulation layer disposed at the encapsulation region and between the first and second substrates; and a reflective layer disposed at the encapsulation region and between the first substrate and the encapsulation layer. The reflective layer includes a first reflective region and a second reflective region configured to satisfy one of the following: in a first direction, a gap between the first and second reflective regions is greater than or equal to a first predetermined distance, the first direction being from the display region to the encapsulation region, and in a second direction, a gap between the first and second reflective regions is greater than or equal a second predetermined distance, the second direction being parallel to the first substrate and perpendicular to the first direction.

19 Claims, 10 Drawing Sheets

DISPLAY PANEL AND DISPLAY DEVICE

CROSS-REFERENCES TO RELATED APPLICATIONS

This application claims the priority of Chinese Patent Application No. CN201811432719.7, filed on Nov. 28, 2018, the entire contents of all of which are incorporated herein by reference.

FIELD OF THE DISCLOSURE

The present disclosure generally relates to the display technology and, more particularly, relates to a display panel and a display device thereof.

BACKGROUND

With the continuous development of display technology, consumers' demands for display screens are constantly increasing. Various types of displays have been emerged in an endless stream and rapidly developed, such as liquid crystal displays (LCDs), organic light-emitting displays, etc., based on which, various display technologies such as three-dimensional (3D) display, touch control display technology, curved display, ultra high resolution display and privacy display are constantly emerging to meet the demands of consumers.

In an organic light-emitting display panel, substrates disposed opposite to each other are often bonded and sealed by an encapsulation layer, which often includes a glass frit. During the manufacturing process, the glass frit is irradiated by a laser beam to be heated and melted, thereby bonding the two opposite substrates together. To enable the laser beam to fully irradiate the glass frit to enhance the melting effect, a reflective metal layer is often disposed under the glass frit, and the laser beam is reflected by the reflective metal layer to achieve the second laser irradiation, thereby accelerating the melting process of the glass frit. However, because the reflective metal is often disposed in an encapsulation region which is located at the edge of the display panel, when the reflective metal is in a floating state, static electricity generated during cutting, rubbing or transportation is likely to be introduced into the display panel, which degrades the anti-static performance of the display panel and, accordingly, affects the performance of the display panel. Therefore, how to properly configure the reflective metal so as to effectively improve the encapsulation performance and suppress the influence on the anti-static capability of the display panel is a technical issue which is highly desired to be solved. The disclosed display panel and display device thereof are directed to solve one or more problems set forth above and other problems.

BRIEF SUMMARY OF THE DISCLOSURE

One aspect of the present disclosure provides a display panel. The display panel comprises a first substrate and an opposite second substrate; an encapsulation layer disposed between the first substrate and the second substrate; a display region and an encapsulation region disposed at a periphery of the display region; and a reflective layer disposed at the encapsulation region and between the first substrate and the encapsulation layer. The encapsulation layer is disposed at the encapsulation region. The reflective layer includes a first reflective region and a second reflective region configured to satisfy one of the following: in a first direction, a gap between the first reflective region and the second reflective region is greater than or equal to a first predetermined distance, wherein the first direction is pointing from the display region to the encapsulation region; and in a second direction, a gap between the first reflective region and the second reflective region is greater than or equal a second predetermined distance, wherein the second direction is parallel to the first substrate and perpendicular to the first direction.

Another aspect of the present disclosure provides a display device. The display device comprises a display panel. The display panel comprises a first substrate and an opposite second substrate; an encapsulation layer disposed between the first substrate and the second substrate; a display region and an encapsulation region disposed at a periphery of the display region; and a reflective layer disposed at the encapsulation region and between the first substrate and the encapsulation layer. The encapsulation layer is disposed at the encapsulation region. The reflective layer includes a first reflective region and a second reflective region configured to satisfy one of the following: in a first direction, a gap between the first reflective region and the second reflective region is greater than or equal to a first predetermined distance, wherein the first direction is pointing from the display region to the encapsulation region; and in a second direction, a gap between the first reflective region and the second reflective region is greater than or equal a second predetermined distance, wherein the second direction is parallel to the first substrate and perpendicular to the first direction.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

Figure 1:
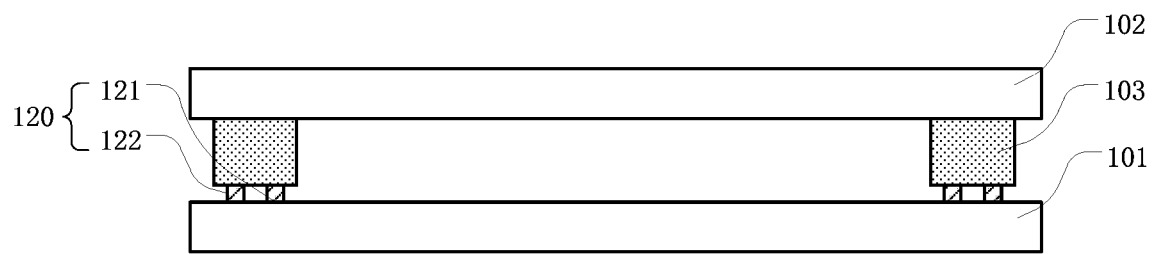
FIG. 1 illustrates a schematic cross-sectional view of an exemplary display panel consistent with the disclosed embodiments.
Figure 2:
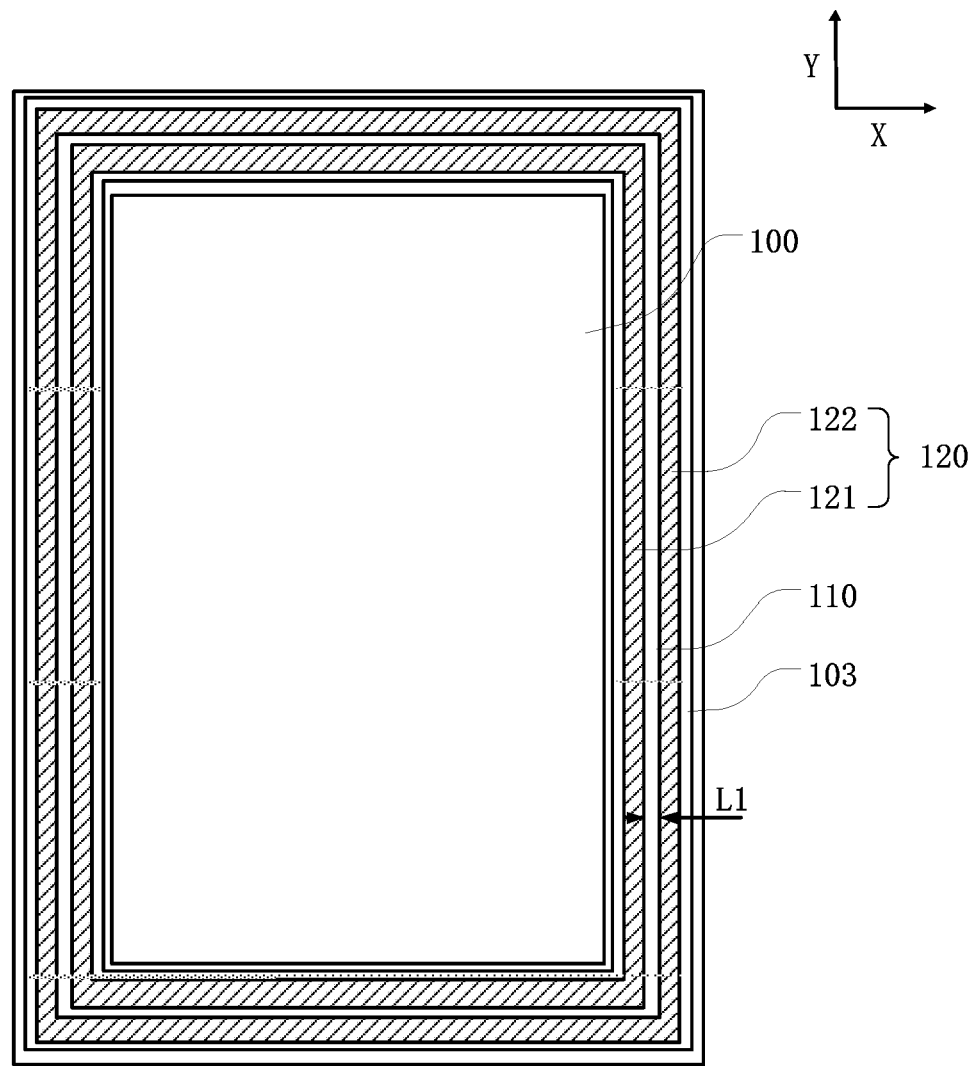
FIG. 2 illustrates a schematic top view of an exemplary display panel consistent with the disclosed embodiments.

The present disclosure provides a display panel. FIG. 1 illustrates a schematic cross-sectional view of an exemplary display panel 10 consistent with the disclosed embodiments; FIG. 2 illustrates a schematic top view of an exemplary display panel consistent with the disclosed embodiments; and FIG. 3 illustrates a schematic top view of another exemplary display panel consistent with the disclosed embodiments.

Figure 3:
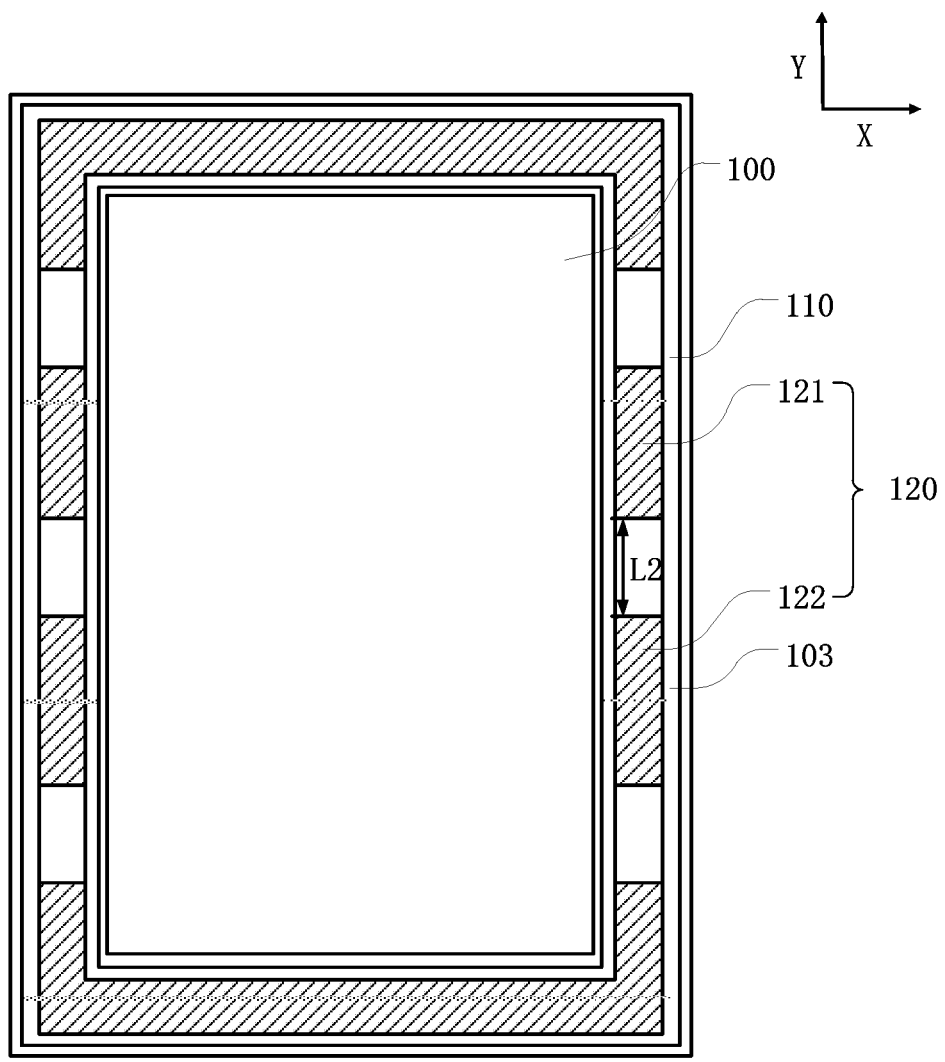
FIG. 3 illustrates a schematic top view of another exemplary display panel consistent with the disclosed embodiments.

As shown in FIGS. 1-3, the display panel 10 may include a first substrate 101, a second substrate 102 disposed opposite to the first substrate 101, an encapsulation layer 103 disposed between the first substrate 101 and the second substrate 102, a display region 100, an encapsulation region 110 disposed at a periphery of the display region 100, and a reflective layer 120. In particular, the encapsulation layer 103 may be disposed at the encapsulation region 110. The reflective layer 120 may be disposed at the encapsulation region 110 and, meanwhile, disposed between the first substrate 101 and the encapsulation layer 103.

The reflective layer 120 may include a first reflective region 121 and a second reflective region 122. In one embodiment, as shown in FIG. 2, in a first direction X, a gap between the first reflective region 121 and the second reflective region 122 may be equal to or greater than a first predetermined distance L1. The first direction X may be a direction pointing from the display region 100 to the encapsulation region 110. For illustrative purposes, FIG. 2 shows in the first direction X, the gap between the first reflective region 121 and the second reflective region 122 may be equal to the first predetermined distance L1.

In another embodiment, as shown in FIG. 3, in a second direction Y, a gap between the first reflective region 121 and the second reflective region 122 may be equal to or greater than a second predetermined distance L2. The second direction Y may be parallel to the first substrate 101 and perpendicular to the first direction X. For illustrative purposes, FIG. 3 shows in the second direction Y, the gap between the first reflective region 121 and the second reflective region 122 may be equal to the second predetermined distance L2.

In the disclosed embodiments, the display panel 10 may be a plasma display panel, a field emission display panel, a light-emitting display panel, an organic light-emitting display panel, a liquid crystal display (LCD) panel, a quantum dots (QDs) display panel, an electrophoretic display panel, a nanoblock display panel etc. Further, the display panel 10 may include any appropriate type of display panels which are not limited by the present disclosure.

In one embodiment, the display panel 10 may be an organic light-emitting display panel, which includes an anode, a cathode, and an organic light-emitting layer between the anode and the cathode. A voltage applied between the anode and the cathode may excite carrier migration, which acts on the organic light-emitting layer to emit light. In addition, the first direction X and the second direction Y are relative. Because the first direction X is the direction pointing from the display region 100 to the encapsulation region 110, after the first direction X is determined, the second direction Y (i.e., a direction perpendicular to the first direction X) is determined accordingly. Thus, when the first direction X changes, the second direction Y may also change accordingly.

In the disclosed embodiments, the reflective layer 120 may be disposed between the first substrate 101 and the encapsulation layer 103. During the encapsulation process of the display panel, laser may be irradiated onto the encapsulation layer 103, and the encapsulation layer 103 may be melted under the laser irradiation. After the laser is reflected by the reflective layer 120, the encapsulation layer 103 may be subjected to the second laser irradiation, such that the melting process of the encapsulation layer 103 may be accelerated, and the encapsulation efficiency and encapsulation performance may be improved. In one embodiment, the first substrate 101 may be an array substrate, and the second substrate 102 may be a cover plate, which will not be described in detail.

In one embodiment, the first predetermined distance L1 may be configured to be approximately 50 µm≤L1≤200 µm, and the second predetermined distance L2 may be configured to be approximately L2≥100 µm. As the current display panel desires a narrow frame, when the first predetermined distance L1 is too large, the frame of the display panel 10 may be substantially large. When the first predetermined distance L1 is too small, the first reflective region 121 and the second reflective region 122 may be easily in contact with each other, which may degrade the blocking of static electricity.

In the disclosed display panel, the reflective layer 120 may include the first reflective region 121 and the second reflective region 122. In the first direction X, the gap between the first reflective region 121 and the second reflective region 122 may be greater than or equal to the first predetermined distance L1, or in the second direction Y, the gap between the first reflective region 121 and the second reflective region 122 may be greater than or equal to the second predetermined distance L2, such that the reflective region may be discontinuous, and the area of the reflective region may be reduced and, accordingly, the static electricity may be less likely to be introduced into the reflective region. In addition, through configuring the reflective region to be discontinuous (i.e., disconnecting the reflective region), the transmission path of static electricity may be disconnected, which may further reduce the possibility of introducing static electricity into the reflective region, thereby ensuring the antistatic capability of the display panel.

In one embodiment, the ratio of the total area S1 of the reflective layer 120 to the total area S2 of the encapsulation layer may be configured to be S1:S2≤1:2. In an existing design, to enhance the encapsulation effect of the reflective layer, a whole reflective layer may be disposed under the encapsulation layer, leading to a substantially large area of the reflective layer. The existing design may enhance the encapsulation effect; however, the reflective layer may form a complete line that introduces static electricity into the display region, which increases the risk of electrostatic interference in the display region. In the disclosed embodiments, the area of the reflective layer may be reduced and, thus, the possibility of introducing static electricity into the reflective layer may be reduced. Accordingly, the risk of electrostatic interference in the display region may be reduced.

In one embodiment, as shown in FIG. 2, along the first direction X, the sum W1 of the widths of the reflective layer 120 and the sum W2 of the widths of the encapsulation layer 103 may be configured to satisfy W1:W2≤1:2. As described above, through reducing the area of the reflective layer, the risk of electrostatic interference in the display region may be reduced. Thus, as shown in FIG. 2, in the first direction, when the gap between the first reflective region 121 and the second reflective region 122 is greater than or equal to the first predetermined distance L1, through configuring W1:W2≤1:2, the area of the reflective layer may be reduced, and the risk of electrostatic interference in the display region may be reduced accordingly.

In one embodiment, as shown in FIG. 2, in the first direction X, the gap between the first reflective region 121 and the second reflective region 122 may be greater than or equal to the first predetermined distance L1, and both the first reflective region 121 and the second reflective region 122 may be disposed surrounding the display region 100. The first reflective region 121 may have a first side away from the display region 100 and an opposing second side, and the second reflective region 122 may be disposed at the first side of the first reflective region 121. Although the first reflective region 121 and the second reflective region 122 are disconnected from each other, because the reflective region mainly functions to reflect the laser to achieve the second laser irradiation, the temperature of the region subjected to the second laser irradiation may rise rapidly, and the generated heat may be transferred to adjacent regions. Through appropriately configuring the gap between the first reflective region 121 and the second reflective region 122, the region between the first reflective region 121 and the second reflective region 122 may also be heated rapidly and melted. Thus, although the area of the reflective region is reduced, the encapsulation performance may not be degraded.

Figure 4A:
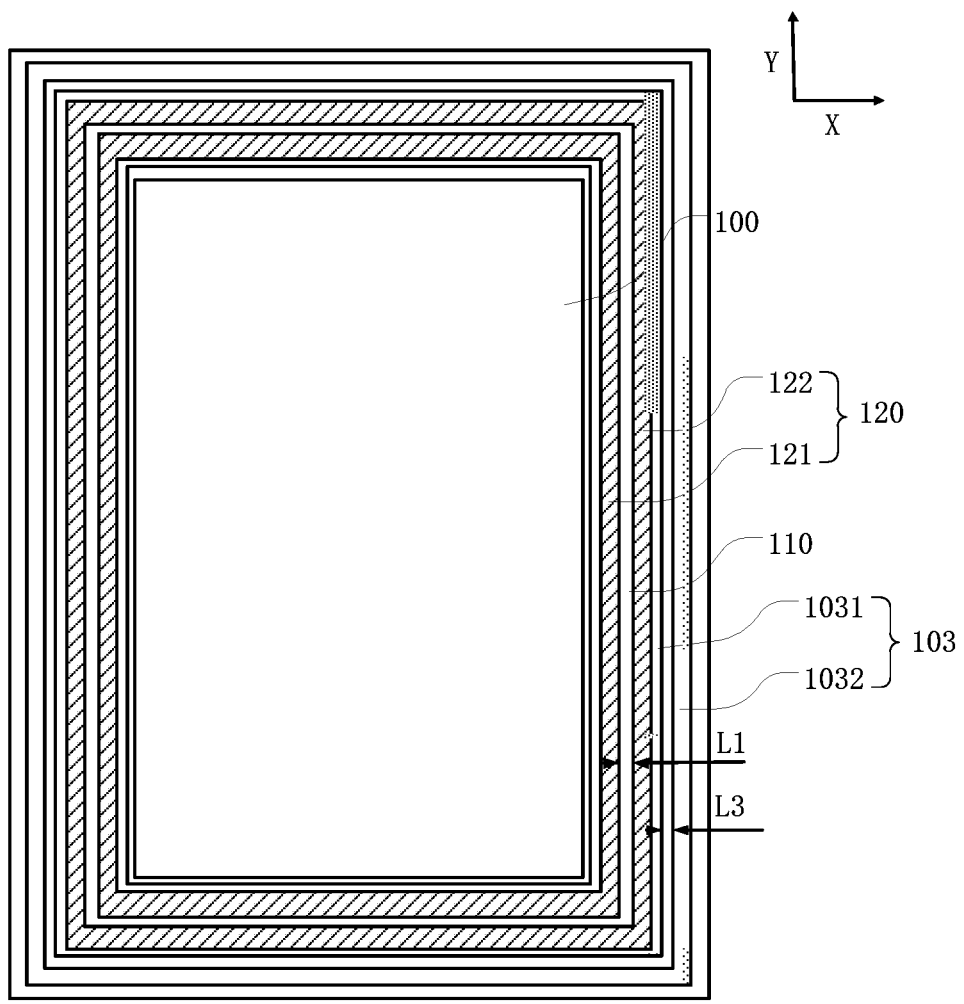
FIG. 4A illustrates a schematic top view of another exemplary display panel consistent with the disclosed embodiments.
Figure 4B:
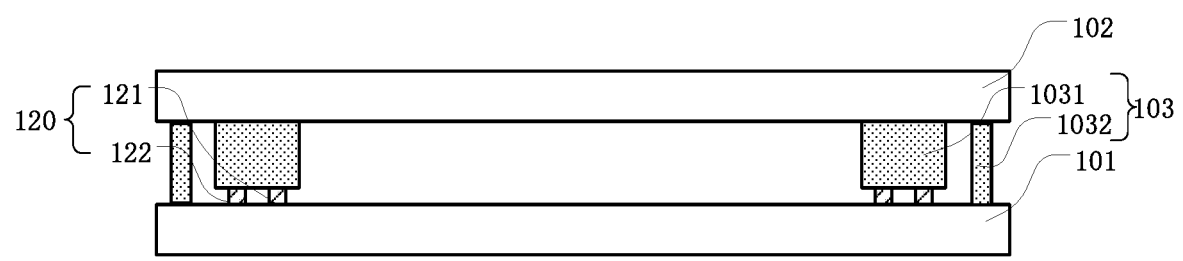
FIG. 4B illustrates a schematic cross-sectional view of another exemplary display panel in FIG. 4A consistent with the disclosed embodiments.

FIG. 4A illustrates a schematic top view of another exemplary display panel consistent with the disclosed embodiments, and FIG. 4B illustrates a schematic cross-sectional view of another exemplary display panel in FIG. 4A consistent with the disclosed embodiments. The similarities between FIGS. 4A-4B and FIGS. 1-2 are not repeated, while certain difference may be explained.

As shown in FIG. 4A, the encapsulation layer 103 may include a first encapsulation region 1031 and a second encapsulation region 1032. In the first direction X, the gap between the first encapsulation region 1031 and the second encapsulation region 1032 may be greater than or equal to a third predetermined distance L3. The first encapsulation region 1031 may have a first side away from the display region 100 and an opposing second side, and the second encapsulation region 1032 may be disposed at the first side of the first encapsulation region 1031. For illustrative purposes, FIG. 4 shows in the first direction X, the gap between the first encapsulation region 1031 and the second encapsulation region 1032 may be equal to the third predetermined distance L3.

Further, as shown in FIG. 4B, in a direction perpendicular to the first substrate 101, the reflective layer 120 may be only located within a region covered by the first encapsulation region 1031. In one embodiment, as shown in FIG. 4B, in the direction perpendicular to the first substrate 101, the reflective layer 120 may be only located within a region fully covered by the first encapsulation region 1031. Through disconnecting the first encapsulation region 1031 and the second encapsulation region 1032 from each other in the first direction X and disposing the reflective layer 120 only at the first side of the first encapsulation region 1031, the encapsulation performance of the first encapsulation region 1031 may be ensured. Meanwhile, the second encapsulation region 1032 may be not provided with a reflective layer, such that the external static electricity may be less likely to enter the display region 100. The arrangement of the reflective layer 120 may enhance the encapsulation performance of the first encapsulation region 1031, which may ensure the encapsulation of the display panel. Thus, even the second encapsulation region 1032 is not provided with a reflective layer, the encapsulation of the display panel may not be affected.

Figure 5A:
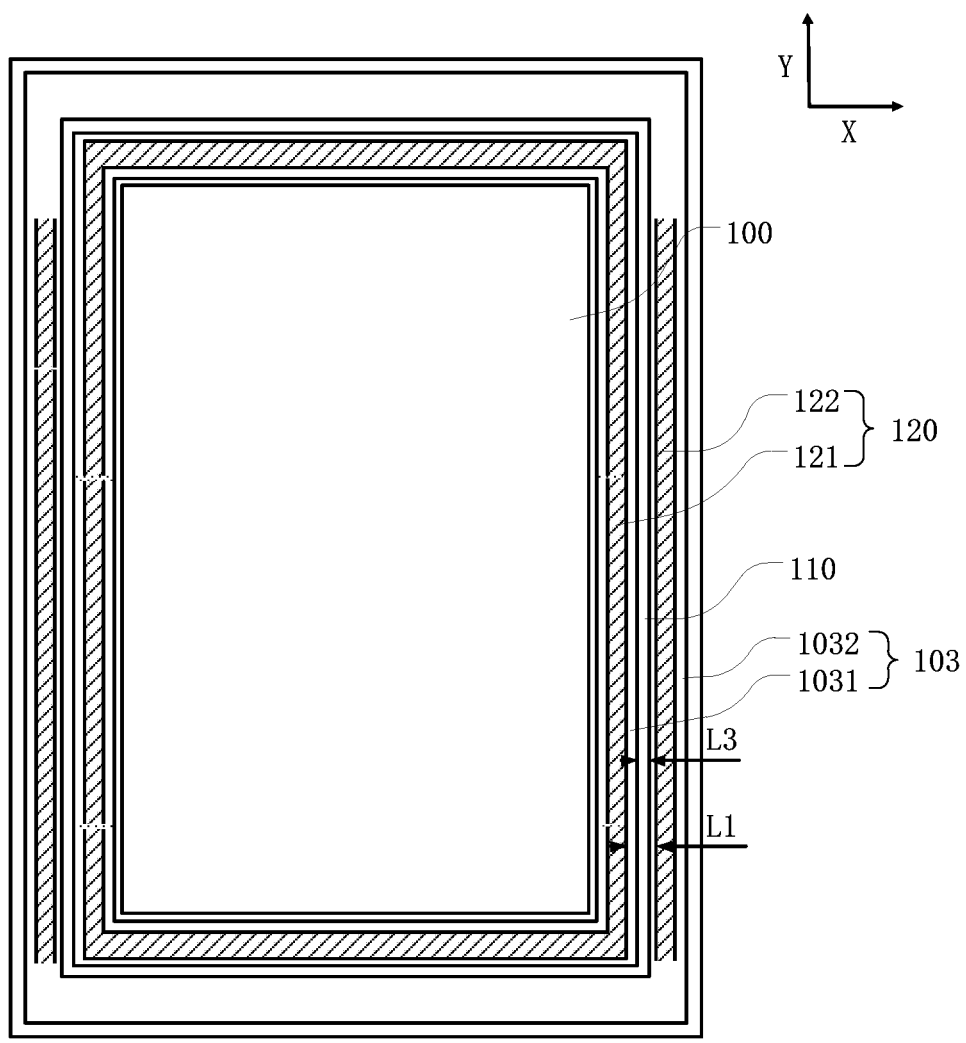
FIG. 5A illustrates a schematic top view of another exemplary display panel consistent with the disclosed embodiments.
Figure 5B:
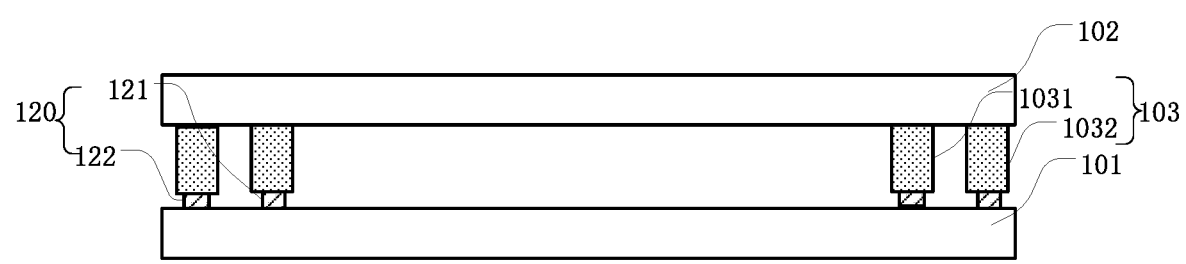
FIG. 5B illustrates a schematic cross-sectional view of another exemplary display panel in FIG. 5A consistent with the disclosed embodiments.

FIG. 5A illustrates a schematic top view of another exemplary display panel consistent with the disclosed embodiments, and FIG. 5B illustrates a schematic cross-sectional view of another exemplary display panel in FIG. 5A consistent with the disclosed embodiments. The similarities between FIGS. 4A-4B and FIGS. 5A-5B are not repeated, while certain difference may be explained.

As shown in FIGS. 5A-5B, in the direction perpendicular to the first substrate 101, the first reflective region 121 may be located within a region covered by the first encapsulation region 1031, and the second reflective region 122 may be located within a region covered by the second encapsulation region 1032. In one embodiment, as shown in FIG. 5B, in the direction perpendicular to the first substrate 101, the first reflective region 121 may located within a region fully covered by the first encapsulation region 1031, and the second reflective region 122 may be located within a region fully covered by the second encapsulation region 1032. Thus, the encapsulation performance of the first encapsulation region 1031 and second encapsulation region 1032 may be simultaneously ensured. Meanwhile, because the first reflective region 121 and the second reflective region 122 are disconnected from each other, the possibility of introducing static electricity into the first reflective region 121 may be reduced and, accordingly, the corresponding electrostatic interference in the display region 100 may be reduced.

In the disclosed embodiments, to further reduce the area of the reflective region without affecting the overall encapsulation performance, the reflective layer may be patterned and divided into a plurality of reflective regions, which may be disposed surrounding the display region and gradually away from the display region along the first direction X. The gap between the reflective regions may be greater than or equal to the first predetermined distance L1. In one embodiment, in the first direction X which is pointing from the display region 100 to the encapsulation region 110, the gap between adjacent reflective regions may be greater than or equal to the first predetermined distance L1. Thus, the area of the reflective region may be further reduced and, accordingly, the possibility of introducing static electricity into the reflective layer may be further reduced.

Figure 6:
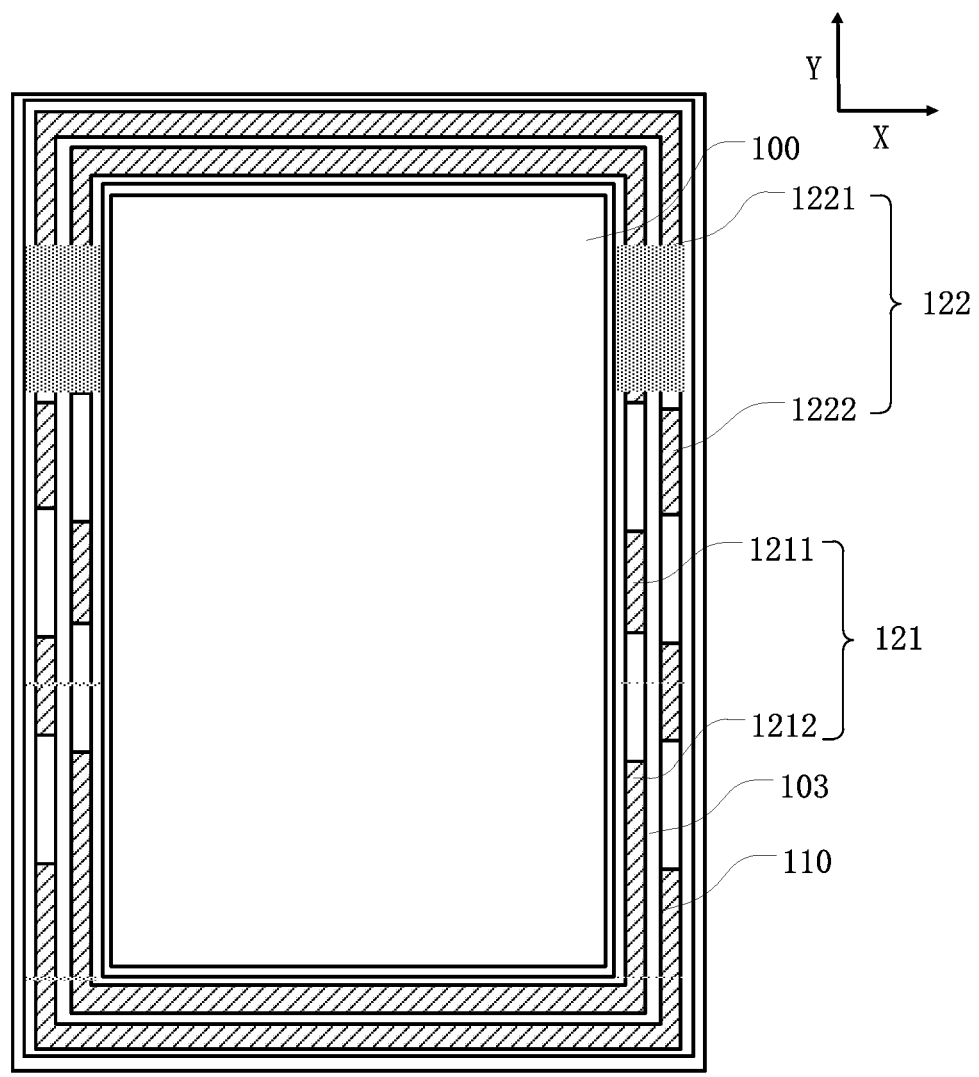
FIG. 6 illustrates a schematic top view of another exemplary display panel consistent with the disclosed embodiments.

FIG. 6 illustrates a schematic top view of another exemplary display panel consistent with the disclosed embodiments. The similarities between FIG. 6 and FIG. 3 are not repeated, while certain difference may be explained.

As shown in FIG. 6, the first reflective region 121 may include a first sub-reflective region 1211 and a second sub-reflective region 1212, and in the second direction Y, a gap between the first sub-reflective region 1211 and the second sub-reflective region 1212 may be greater than or equal to the second predetermined distance L2. The second reflective region 122 may include a third sub-reflective region 1221 and a fourth sub-reflective region 1222, and in the second direction Y, a gap between the third sub-reflective region 1221 and the fourth sub-reflective region 1222 may be greater than or equal to the second predetermined distance L2. Further, the gap between the first sub-reflective region 1211 and the second sub-reflective region 1212 and gap between the third sub-reflective region 1221 and the fourth sub-reflective region 1222 may not overlap in the first direction X.

Thus, the reflective regions may be disconnected in both the first direction X and the second direction Y and, meanwhile, the positions (i.e., gaps) where the two reflection regions are disconnected in the second direction Y do not overlap in the first direction X. Accordingly, the overall encapsulation of the display panel may be ensured, and the area of the reflective layer may be further reduced, which may reduce the possibility of electrostatic interference in the display region.

In certain embodiments, as shown in FIGS. 2 and 4-6, the reflective layer 120 may be disconnected in the first direction X. In certain other embodiments, as shown in FIG. 3, the reflective layer 120 may be disconnected only in the second direction Y, the gap between the reflective region 121 and the second reflective region 122 may be greater than or equal to the second predetermined distance L2, the first reflective region 121 may surround a partial area of the display region 100, and the second reflective region 122 may surround another partial area of the display region 100.

Further, the reflective layer 120 may include a plurality of reflective regions, and the gap between the reflective regions may be equal to or greater than the second predetermined distance L2, as shown in FIG. 3. Thus, the area of the reflective layer 120 may be reduced. In addition, in certain embodiments, the encapsulation region 110 may be partially provided with a reflective layer (i.e., a partial region of the encapsulation region 110 may not be provided with a reflective layer), and the reflective layer 120 may be only distributed over a partial region of the display panel.

Figure 7:
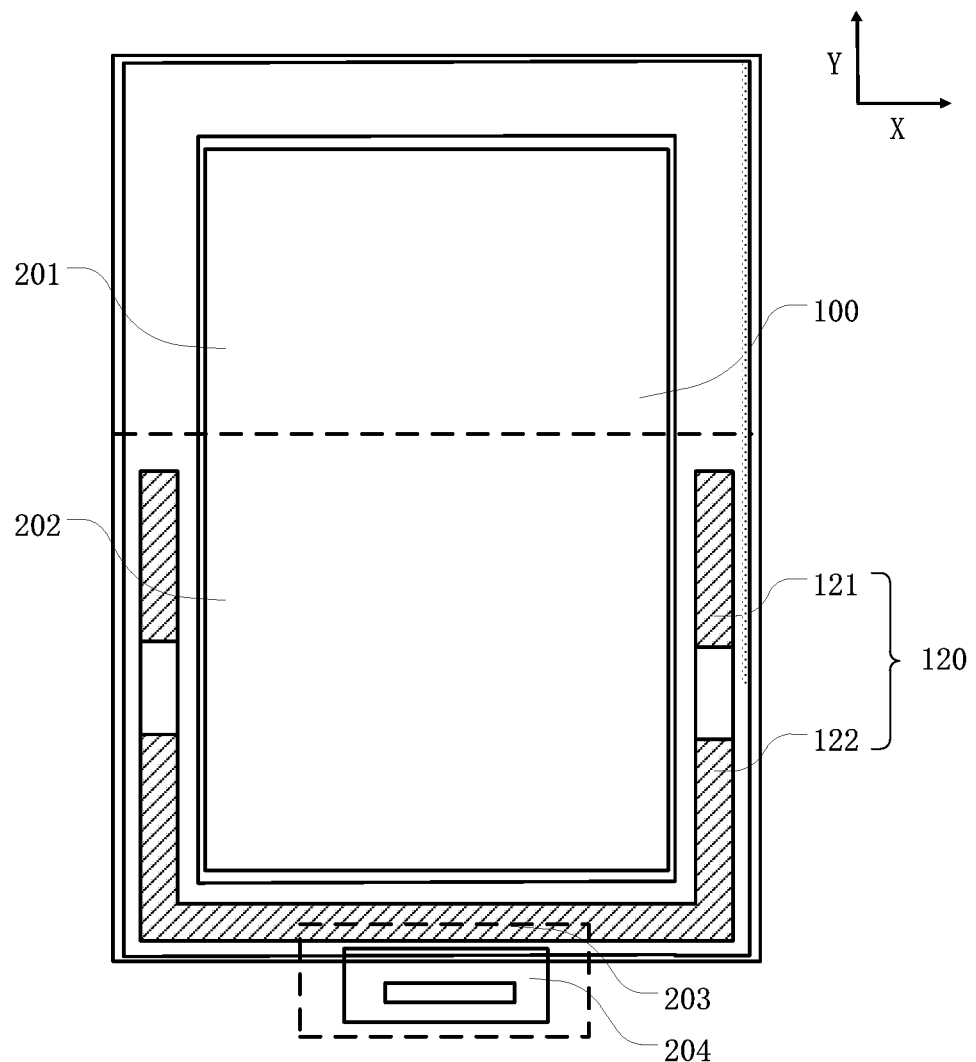
FIG. 7 illustrates a schematic top view of another exemplary display panel consistent with the disclosed embodiments.

FIG. 7 illustrates a schematic top view of another exemplary display panel 10 consistent with the disclosed embodiments. As shown in FIG. 7, the display panel 10 may include a first region 201 and a second region 202, and the second region 202 may include a bonding region to bond a printed circuit board 204. The first region 201 and the second region 202 may be arranged opposite to each other in the second direction Y.

In one embodiment, the reflective layer 120 may be disposed at the second region 202, and the first region 201 may be not provided with the reflective layer 120. In the display panel, the second region 202 is disposed with the bonding region configured to bond the printed circuit board 204, which is often provided with a grounded terminal. Thus, the second region 202 may be less likely to generate static electricity than the first region 201, and the reflective layer of the first region 202 may be removed such that the two sides of the encapsulation layer 103 in the first region 201 may be in contact with the first substrate 101 and the second substrate 102, respectively, which may enhance the bonding strength of the encapsulation layer 103 and the substrates. On the other hand, the second region 202 may be provided with the reflective layer 120, which may increase the speed of heating the encapsulation materials upon the laser irradiation, thereby fully melting the encapsulation materials.

Figure 8:
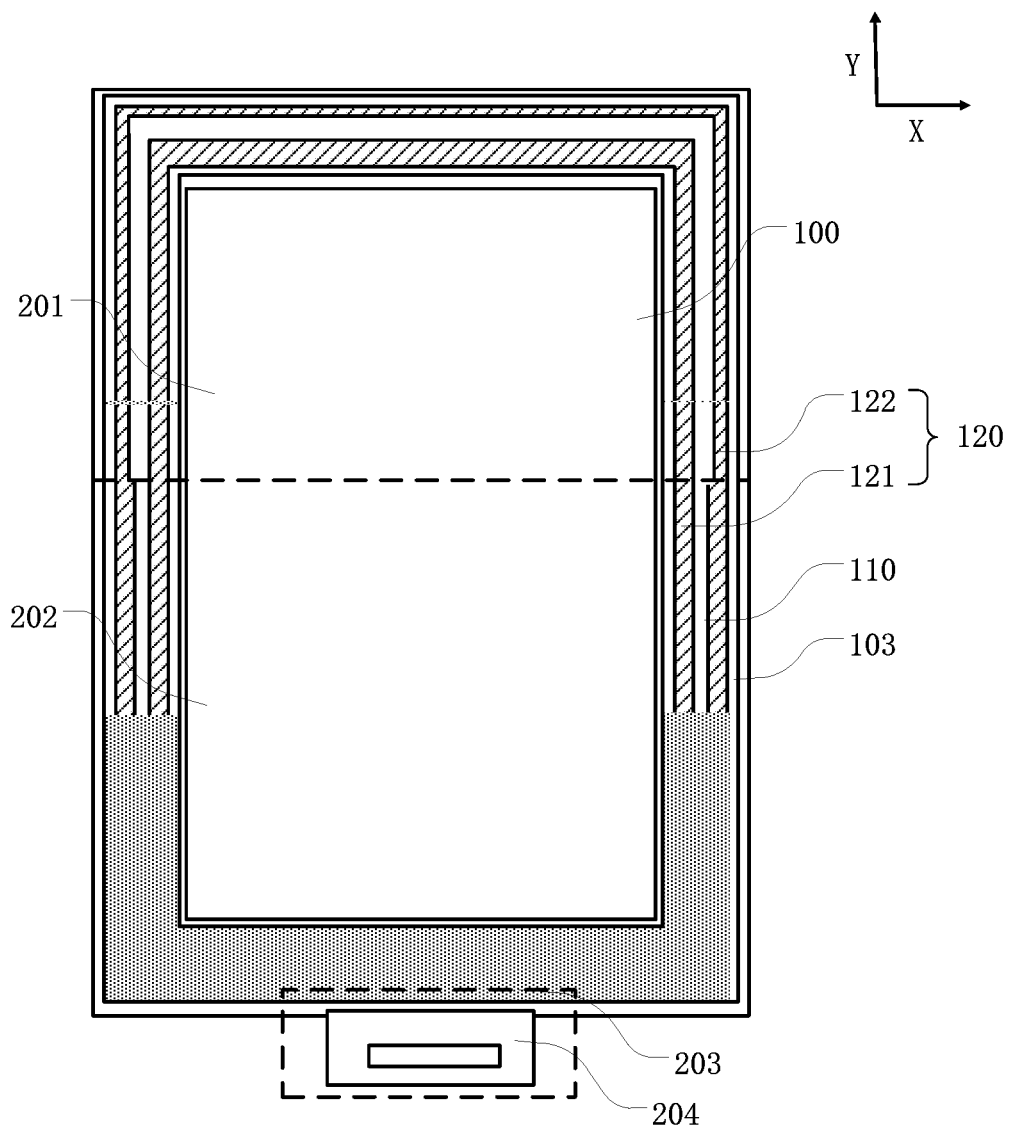
FIG. 8 illustrates a schematic top view of another exemplary display panel consistent with the disclosed embodiments.
Figure 9:
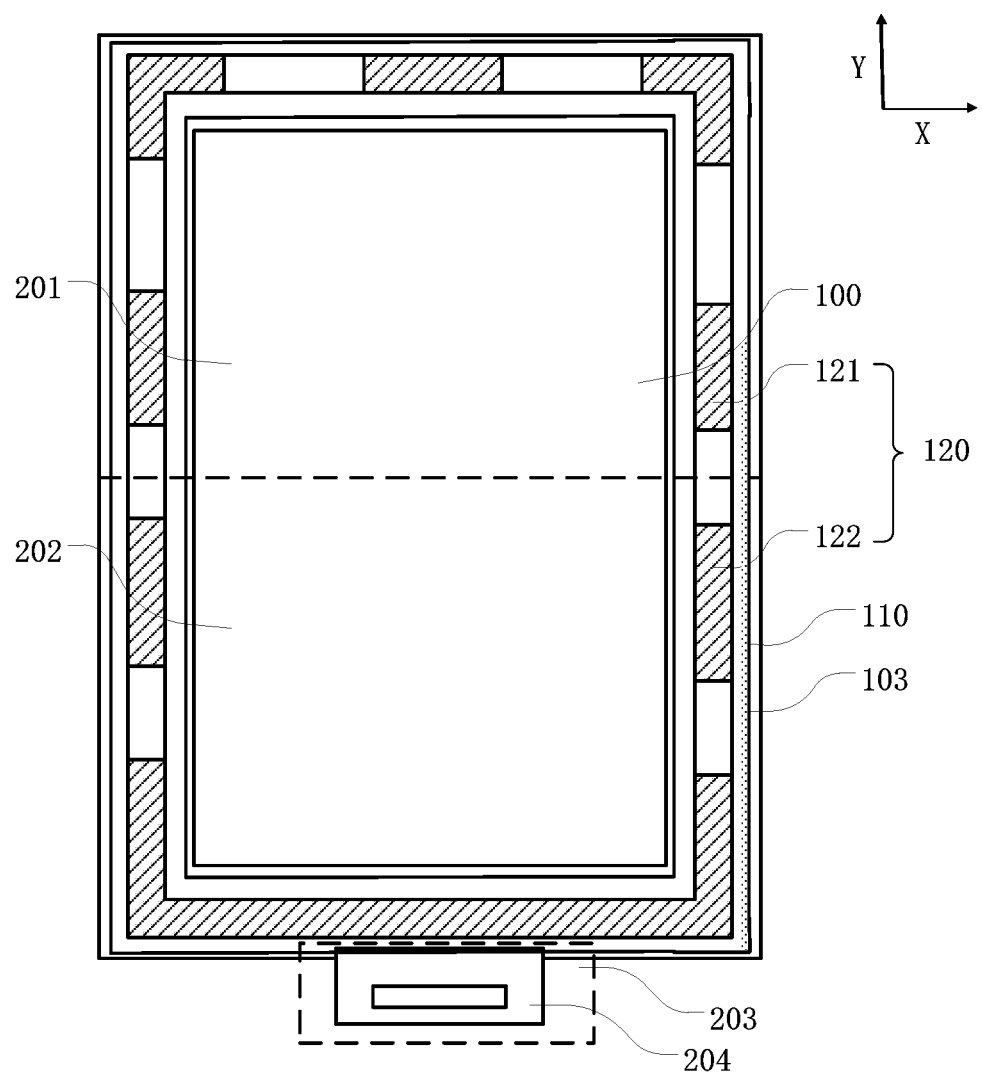
FIG. 9 illustrates a schematic top view of another exemplary display panel consistent with the disclosed embodiments.

FIG. 8 illustrates a schematic top view of another exemplary display panel consistent with the disclosed embodiments, and FIG. 9 illustrates a schematic top view of another exemplary display panel consistent with the disclosed embodiments. The similarities between FIG. 7 and FIGS. 8-9 are not repeated, while certain difference may be explained.

As shown in FIGS. 8-9, in the first region 201, the ratio of a total area S11 of the reflective layer to a total area S12 of the encapsulation layer is R1, and in the second region 202, the ratio of a total area S21 of the reflective layer to a total area S22 of the encapsulation layer is R2, where R1<R2. Thus, provided that the encapsulation performance of the first region 201 and the second region 202 are ensured, the area of the reflective layer in the first region 201 which is easy to generate static electricity may be reduced, thereby reducing the possibility of electrostatic interference.

Further, as shown in FIG. 8 and FIG. 9, the gap between the first reflective region 121 in the first region 201 and the second reflective region 122 in the first region 201 may be greater than the gap between the first reflective region 121 in the second region 202 and the second reflective region 122 in the second region 202. In one embodiment, as shown in FIG. 8, in the first direction X, the first reflective region 121 and the second reflective region 122 may have a larger gap in the first region 201 than in the second region 202. In another embodiment, as shown in FIG. 9, in the second direction Y, the first reflective region 121 and the second reflective region 122 may have a larger gap in the first region 201 than in the second region 202. Thus, the area of the reflective layer in the first region 201 may be reduced and, accordingly, the risk of the first region 201 being subjected to electrostatic interference may be reduced.

The material of the reflective layer 120 may include a metal material. In one embodiment, the reflective layer 120 may be disposed at the same layer and made of the same material as the gate electrodes of thin-film transistors (TFTs) in the driving elements of the display panel. In another embodiment, the reflective layer 120 may be disposed at the same layer and made of the same material as the source-drain electrodes of thin-film transistors (TFTs) in the driving elements of the display panel. The material of the reflective layer 120 may merely include molybdenum (Mo), or may include a titanium/aluminum/titanium (Ti/Al/Ti) three-layer composite. In another embodiment, the reflective layer 120 may include other materials capable of reflecting laser and having a melting point higher than the encapsulation material.

Figure 10:
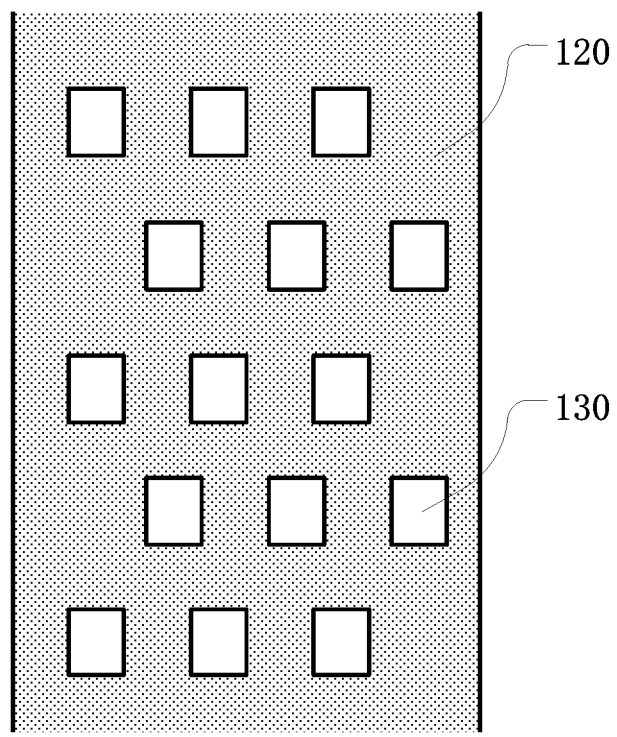
FIG. 10 illustrates a schematic top view of an exemplary reflection layer consistent with the disclosed embodiments.

In addition, to reduce the stress on the reflective layer 120, the reflective layer 120 may be configured to have a mesh surface. FIG. 10 illustrates a schematic top view of an exemplary reflection layer consistent with the disclosed embodiments. As shown in FIG. 10, the reflective layer 120 may be configured to have a mesh surface with a plurality of openings 130. The opening 130 may have a rectangular, circular, elliptical or other polygonal shape, or any appropriate shape. The openings 130 may prevent the stress from being concenterred at the reflective layer 120, and suppress the cracks at the reflective layer 120 due to the large thermal stress, thereby ensuring the encapsulation performance of the display panel.

In addition, the encapsulation layer 103 may include a glass frit composition which may include a glass frit and an additive. The additive may enhance the encapsulation performance of the frit, the bonding between the glass frit and the reflective layer 120, and the bonding between the glass frit and substrates (i.e., the first substrate 101 and the second substrate 102).

The present disclosure also provides a display device including any one of the disclosed display panels.

Figure 11:
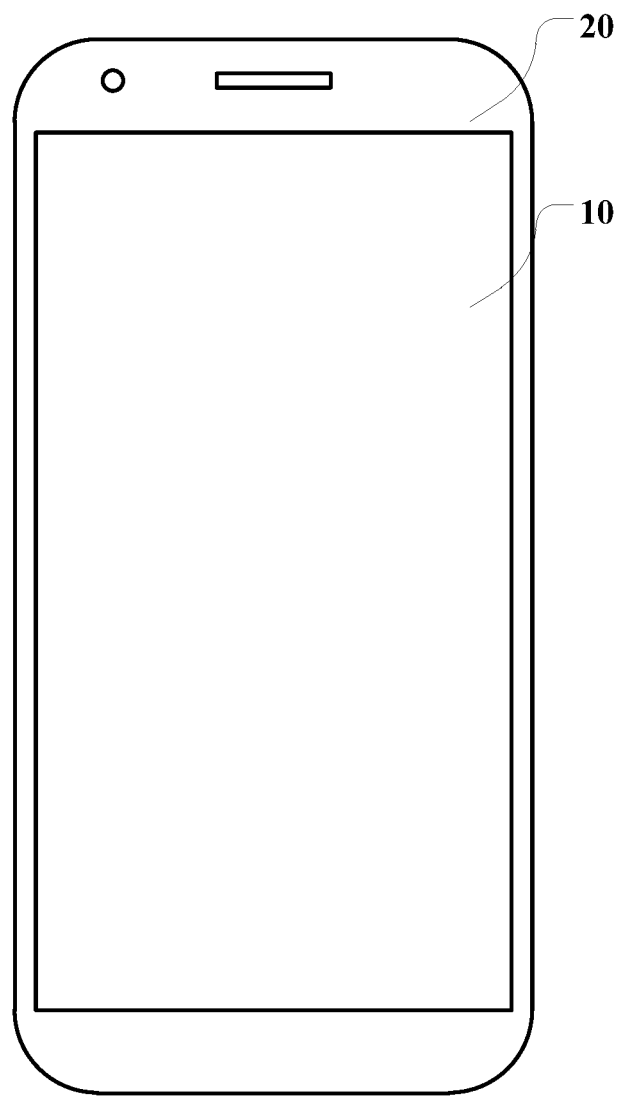
FIG. 11 illustrates an exemplary display device consistent with the disclosed embodiments.

FIG. 11 illustrates an exemplary display device 20 consistent with the disclosed embodiments. As shown in FIG. 11, the display device 20 may include a display panel 10, which is any one of the disclosed display panels. The display device 20 may be a mobile phone, a notebook, a television, a watch, or a smart wearable display device, etc., which is not limited by the present disclosure.

In the disclosed embodiments, through patterning the reflection layer 120 disposed between the encapsulation layer 103 and the first substrate 101, the reflective region 121 and the second reflective region 122 may be configured to have a certain gap in the first direction X or the second direction Y. Thus, provided that the encapsulation performance is ensured, the area of the reflective layer may be reduced and, accordingly, the possibility of introducing static electricity into the reflective layer may be reduced. Meanwhile, the reflective regions may be disconnected, such that the transmission path of the static electricity may be disconnected, which may further reduce the possibility of introducing static electricity into the reflective layer and ensure the antistatic capability of the display panel.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a first substrate and a second substrate disposed opposite to the first substrate;
an encapsulation layer disposed between the first substrate and the second substrate;
a display region and an encapsulation region disposed at a periphery of the display region; and
a reflective layer disposed at the encapsulation region and between the first substrate and the encapsulation layer,
wherein the encapsulation layer is disposed at the encapsulation region,
the reflective layer includes a first reflective region and a second reflective region which are configured to satisfy at least:
the first reflective region and the second reflective region are electrically disconnected from each other, and in a first direction, a gap between the first reflective region and the second reflective region is greater than or equal to a first predetermined distance, wherein the first direction is pointing from the display region to the encapsulation region, and the gap physically divides the reflective layer into the first reflective region and the second reflective region, such that the reflective layer is discontinuous in the first direction.

2. The display panel according to claim 1, wherein:
the reflective layer has a total area of S1, and the encapsulation layer has a total area of S2, where S1:S2≤1:2.

3. The display panel according to claim 1, wherein:
in the first direction, a sum of widths of the reflective layer is W1, and a sum of widths of the encapsulation layer is W2, where W1:W2≤1:2.

4. The display panel according to claim 1, wherein:
in the first direction, the gap between the first reflective region and the second reflective region is greater than or equal to the first predetermined distance;
both the first reflective region and the second reflective region are disposed surrounding display region; and
the first reflective region has a first side away from the display region and an opposing second side, and the second reflective region is disposed at the first side of the first reflective region.

5. The display panel according to claim 4, wherein:
the encapsulation layer includes a first encapsulation region and a second encapsulation region;
in the first direction, a gap between the first encapsulation region and the second encapsulation region is greater than or equal to a third predetermined distance; and
the first encapsulation region has a first side away from the display region and an opposing second side, and the second encapsulation region is disposed at the first side of the first encapsulation region.

6. The display panel according to claim 5, wherein:
in a direction perpendicular to the first substrate, the reflective region is merely located within a region covered by the first encapsulation region.

7. The display panel according to claim 5, wherein:
in a direction perpendicular to the first substrate, the first reflective region is located within a region covered by the first encapsulation region, and the second reflective region is located within a region covered by the second encapsulation region.

8. The display panel according to claim 4, wherein:
the reflective layer further includes a plurality of third reflective regions disposed surrounding the display region and gradually away from the display region along the first direction; and
a gap between adjacent ones of the plurality of third reflective regions is greater than or equal to the first predetermined distance.

9. The display panel according to claim 4, wherein:
the first reflective region includes a first sub-reflective region and a second sub-reflective region, and in the second direction, a gap between the first sub-reflective region and the second sub-reflective region is greater than or equal to the second predetermined distance;
the second reflective region includes a third sub-reflective region and a fourth sub-reflective region, and in the second direction, a gap between the third sub-reflective region and the fourth sub-reflective region is greater than or equal to the second predetermined distance; and
the gap between the first sub-reflective region and the second sub-reflective region and gap between the third sub-reflective region and the fourth sub-reflective region do not overlap in the first direction.

10. The display panel according to claim 1, wherein:
in the second direction, the gap between the first reflective region and the second reflective region is greater than or equal to the second predetermined distance;
the first reflective region surrounds a partial area of the display region; and
the second reflective region surrounds another partial area of the display region.

11. The display panel according to claim 10, wherein:
the reflective layer includes a plurality of reflective regions; and
a gap between adjacent ones of the plurality of reflective regions is greater than or equal to the second predetermined distance.

12. The display panel according to claim 1, wherein:
the display panel includes a first region and an opposite second region; and
the second region includes a bonding region configured to bond a printed circuit board.

13. The display panel according to claim 12, wherein:
the reflective layer is disposed at the second region but not at the first region.

14. The display panel according to claim 12, wherein:
in the first region, a ratio of a total area of the reflective layer to a total area of the encapsulation layer is R1, and
in the second region, a ratio of a total area of the reflective layer to a total area of the encapsulation layer is R2, where R1≤R2.

15. The display panel according to claim 12, wherein:
the first reflective region and the second reflective region has a larger gap in the first region than in the second region.

16. The display panel according to claim 1, wherein:
the reflective layer includes a metal material.

17. The display panel according to claim 1, wherein:
the reflective layer has a mesh surface.

18. The display panel according to claim 1, wherein:
the encapsulation layer includes a glass frit composition, and
the glass frit composition includes a glass frit and an additive.

19. A display device, comprising:
a display panel, wherein the display panel comprises:
    a first substrate and a second substrate disposed opposite to the first substrate;
    an encapsulation layer disposed between the first substrate and the second substrate;
    a display region and an encapsulation region disposed at a periphery of the display region; and
    a reflective layer disposed at the encapsulation region and between the first substrate and the encapsulation layer,
    wherein the encapsulation layer is disposed at the encapsulation region,
    the reflective layer includes a first reflective region and a second reflective region which are configured to satisfy at least:
    the first reflective region and the second reflective region are electrically disconnected from each other, and
    in a first direction, a gap between the first reflective region and the second reflective region is greater than or equal to a first predetermined distance, wherein the first direction is pointing from the display region to the encapsulation region, and the gap physically divides the reflective layer into the first reflective region and the second reflective region, such that the reflective layer is discontinuous in the first direction.

* * * * *